(12) United States Patent
Mroszczyk (10) Patent No.: US 10,886,940 B1
(45) Date of Patent: Jan. 5, 2021

(54) CIRCUITS AND METHODS PROVIDING A SWITCHED CAPACITOR INTEGRATOR

(71) Applicant: QUALCOMM Incorporated, San Diego, CA (US)

(72) Inventor: Przemyslaw Jan Mroszczyk, Cork (IE)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 16/892,193

(22) Filed: Jun. 3, 2020

(51) Int. Cl.
| | | |
|---|---|---|
| *H03M 3/00* | (2006.01) | |
| *H03F 1/34* | (2006.01) | |
| *G06G 7/186* | (2006.01) | |
| *G05F 3/30* | (2006.01) | |
| *H03H 19/00* | (2006.01) | |

(52) U.S. Cl.
CPC .............. *H03M 3/496* (2013.01); *G05F 3/30* (2013.01); *G06G 7/186* (2013.01); *H03F 1/34* (2013.01); *H03H 19/004* (2013.01); *H03M 3/39* (2013.01)

(58) Field of Classification Search
CPC ...... H03M 3/496; H03M 3/39; H03H 19/004; G06G 7/186; H03F 1/34; G05F 3/30
USPC .......................................................... 341/143
See application file for complete search history.

(56) References Cited

U.S. PATENT DOCUMENTS 5,689,206 A * 11/1997 Schaller ................. G06G 7/186
327/336
8,274,179 B2   9/2012 Fagg et al.
9,218,514 B2 * 12/2015 Kim ...................... H03M 3/496

* cited by examiner

*Primary Examiner* — Khai M Nguyen
(74) *Attorney, Agent, or Firm* — Haynes and Boone, LLP (36340)

(57) ABSTRACT

An integrator circuit includes: an operational amplifier; a first capacitor coupled to an input of the operational amplifier; a second capacitor coupled in parallel to the first capacitor so that a first terminal of the first capacitor is configured to be electrically coupled to a first terminal of the second capacitor by a first switch; and a second switch configured to electrically couple the first terminal of the second capacitor to a second terminal of the first capacitor.

27 Claims, 9 Drawing Sheets

CIRCUITS AND METHODS PROVIDING A SWITCHED CAPACITOR INTEGRATOR

TECHNICAL FIELD

The present application relates, generally, to integrator circuits and, more specifically, to switched-capacitor integrator circuits.

BACKGROUND

Some systems use integrator circuits, e.g., to measure a voltage. For instance, one system has a sampling capacitor disposed within a switch network. During a first phase, referred to as a sampling phase, the switch network couples the sampling capacitor between ground and the voltage to be measured. During a second phase, referred to as an integration phase, the switch network un-couples the capacitor from the ground and the voltage to be measured and instead couples the capacitor between a reference voltage and an operational amplifier (op amp) input. The output of the op amp is an integrated voltage.

However, a problem may arise when measuring a voltage that may be as high as the reference voltage. Specifically, if the level of the reference voltage and the level of the voltage to be measured are approximately the same, then the integrator may become saturated, thereby potentially failing to provide reliable output.

Accordingly, there is a need for a more reliable integrator and, more specifically, an integrator that is less prone to saturation when measuring the voltage level that is approximately the same as a reference voltage level.

SUMMARY

Various implementations are directed to circuits and methods that provide a more reliable integrator circuit. In one example, the integrator circuit may have a smaller capacitor coupled in parallel with a sampling capacitor. During the sampling phase, both the sampling capacitor and the smaller capacitor are charged. During the integration phase, switches are closed to create a feedback loop with the amplifier, and the terminals of the smaller capacitor are swapped to subtract a portion of the sample charge of the sampling capacitor. The effect is that the dynamic range of the input signal may be compressed, thereby preventing the integrator from saturating and allowing it to provide valuable and reliable output.

According to one implementation, an integrator circuit includes: an operational amplifier; a first capacitor coupled to an input of the operational amplifier; a second capacitor coupled in parallel to the first capacitor so that a first terminal of the first capacitor is configured to be electrically coupled to a first terminal of the second capacitor by a first switch; and a second switch configured to electrically couple the first terminal of the second capacitor to a second terminal of the first capacitor.

According to another implementation, a method of operating an integrator circuit includes: electrically coupling a first terminal of a first capacitor to a first terminal of a second capacitor during a sampling phase of the integrator circuit; and electrically coupling a second terminal of the first capacitor to the first terminal of the second capacitor during an integrating phase of the integrator circuit.

According to another implementation, an integrator circuit includes: an operational amplifier; a first capacitor coupled to an input of the operational amplifier; a second capacitor; and means for electrically coupling the second capacitor in parallel to the first capacitor during a sampling phase of the integrator circuit and for reversing a polarity of the second capacitor with respect to the first capacitor during an integrating phase of the integrator circuit.

According to yet another implementation, a system on chip (SOC) includes: a bandgap reference generator configured to produce a bandgap voltage; an analog-to-digital converter (ADC) coupled to receive the bandgap voltage from the bandgap reference generator; wherein the ADC includes an integrator circuit having a first capacitor and a second capacitor, the second capacitor being coupled in parallel to the first capacitor so that a first terminal of the first capacitor is configured to be electrically coupled to a first terminal of the second capacitor by a first switch and a second switch configured to electrically couple the first terminal of the second capacitor to a second terminal of the first capacitor.

DETAILED DESCRIPTION

Various implementations provided herein include circuits and methods to provide more reliable switched-capacitor integrator circuits. In some implementations, the switched-capacitor integrator circuits may be included in an analog-to-digital converter (ADC), though the scope of implementations is not limited to ADCs.

An example implementation includes an integrator circuit having a sampling capacitor coupled to an input of an operational amplifier (op amp) and an additional capacitor coupled in parallel to the sampling capacitor so that a first terminal of the sampling capacitor is coupled to a first terminal of the additional capacitor by a first switch. The integrator circuit also has a second switch that couples the first terminal of the additional capacitor to a second terminal of the sampling capacitor. Therefore, during a sampling phase, the sampling capacitor and the additional capacitor may both be charged. During the integrating phase, the terminals of the additional capacitor are swapped, which subtracts a portion of the sample charge from the sampling capacitor.

Continuing with this example, subtracting a portion of the sample charge causes a dynamic range of the input signal to be compressed. In this example, the input signal may be a voltage that is to be measured. Furthermore, the integrator circuit may use a reference voltage that has a level that is approximately the same as a level of the voltage to be measured. However, since the input voltage (the voltage to be measured) has had its dynamic range compressed, then its highest level that it reaches may be reduced by a known portion (e.g., 5%), which in this example is enough to prevent saturation of the integrator. Or put another way, the level of the input voltage as it is applied to the operational amplifier may be lower than the reference voltage so that the difference between the input voltage and the reference voltage reduces or avoids saturation.

Further in this example, the integrator circuit may include any appropriate value of capacitance for the sampling capacitor and the additional capacitor. In one example, the additional capacitor has less than 10% of the capacitance of the sampling capacitor. However, in any particular application, the value of the additional capacitor may depend upon the desired level of compression of the dynamic range of the input voltage.

Continuing with the example, the integrator circuit may further receive a first clock signal to the first switch and a second clock signal to the second switch. The first clock signal and the second clock signal may be non-overlapping. When the first clock signal is high, it corresponds to the sampling phase, and when the second clock signal is high, it corresponds to the integration phase of the integrator.

An example application of the integrator circuit includes a Sigma Delta modulator, which comprises an ADC. For instance, the Sigma Delta modulator may be used to measure an output of a band gap reference generator, where the bandgap voltage is approximately the same level as a level of a power rail (VDD). When the integrator circuit measures the bandgap voltage and uses VDD as a reference voltage, then the principles discussed above compress the dynamic range of the bandgap voltage so that the voltage seen by the op amp is different enough from the level of VDD to reduce or avoid saturation of the integrator circuit.

Various implementations may include methods of operating the integrator circuit. For instance, the method may include coupling a first terminal of the sampling capacitor to a first terminal of an additional capacitor during a sampling phase of the integrator circuit. The method may further include coupling a second terminal of the second capacitor to the first terminal of the additional capacitor during an integrating phase of the integrator circuit. In this example, reversing the polarity of the additional capacitor with respect to the sampling capacitor subtracts a portion of the sample charge.

An advantage of some implementations described above is that they may provide improved performance relative to other integrator circuits by reducing or preventing saturation. Another advantage is that various implementations may be implemented by the addition of a small capacitor and a plurality of switches, which provides for a low-power solution and a savings of silicon area compared to a solution that may attempt similar results but add one or more op amps. Any degradation of the signal because of dynamic range compression may be offset by increased linearity of the system. In other words, in various applications, the increased linearity may provide satisfactory operation for a system that measures an input voltage level that is close to a level of a reference voltage, and any lack of precision due to dynamic range compression may be significantly less than a lack of precision that would be expected from saturation.

Figure 1:
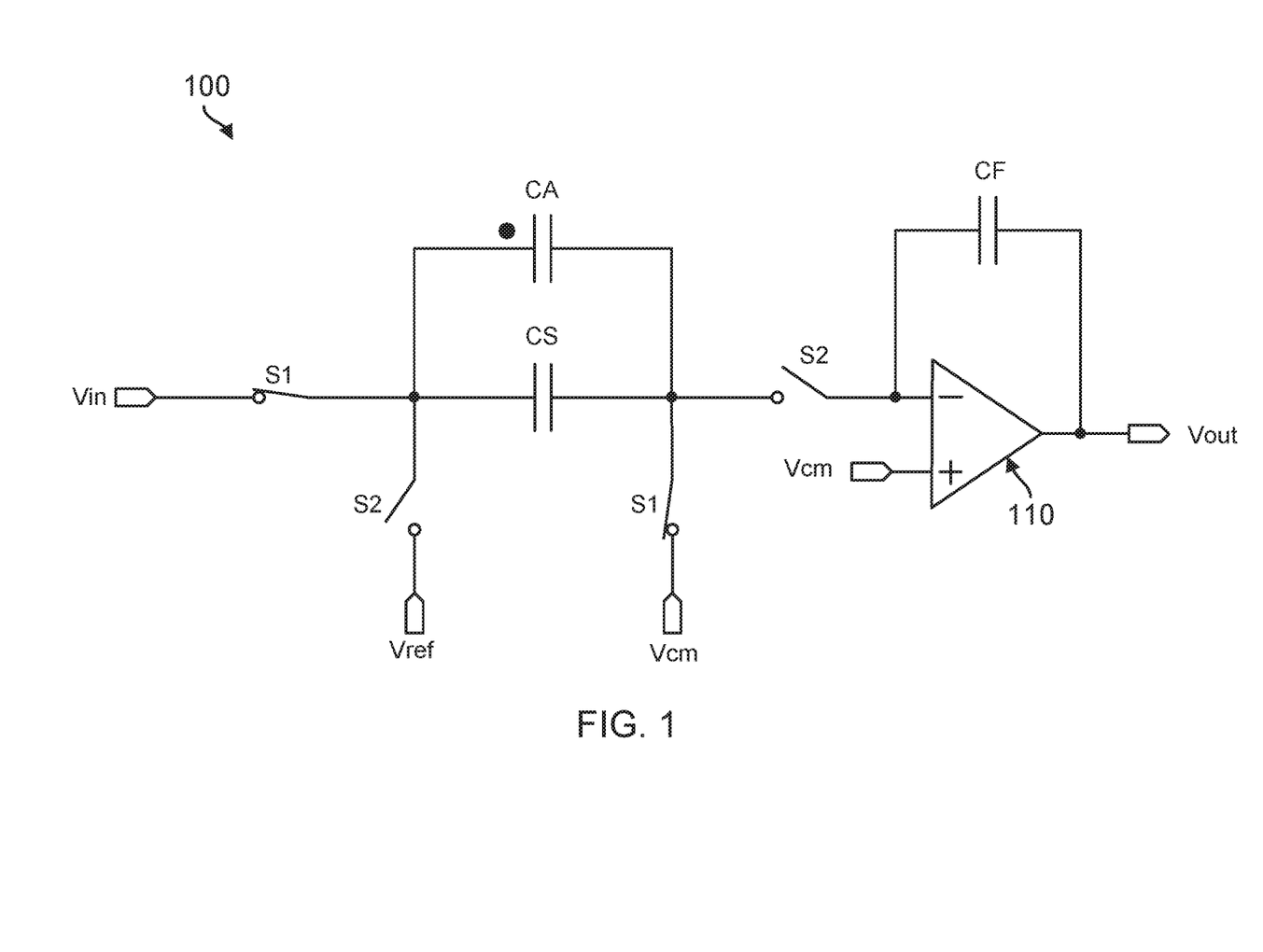
FIG. 1 is an illustration of an example integrator circuit according to various implementations.

FIG. 1 is an illustration of integrator circuit 100, according to one implementation. Integrator circuit 100 includes three different capacitors. Capacitor CS is a sampling capacitor, and it is disposed between the voltage input Vin and the inverting input to the operational amplifier (op amp) 110. Capacitor CA is an additional capacitor, and it is disposed in parallel with the sampling capacitor CS. Capacitor CF is a feedback capacitor that is coupled to both the inverting input of the op amp 110 and the output of the op amp 110.

Integrator circuit 100 also includes various switches to make and break connections. The first set of switches is labeled S1, and the second set of switches is labeled S2.

Looking at the sampling phase first, the S1 switches are on, whereas the S2 switches are off. This creates an electrical path from the voltage input Vin to the terminal labeled Vcm. In this implementation, Vcm may refer to a common mode voltage, which may be used as a virtual ground. In another implementation, Vcm may refer to an actual ground. In any event, in the implementation of FIG. 1, the input voltage Vin is a voltage to be measured, and Vcm is either a virtual ground or ground. The reference voltage Vref refers to a power supply voltage, which may include voltage draindrain (VDD). During the sampling phase, the terminal labeled Vref is uncoupled from the sampling capacitor CS, as is the inverting input to the op amp 110 because switches S2 are closed.

During the sampling phase, capacitor CS is charged. Similarly, additional capacitor CA is also charged because it is connected in parallel with sampling capacitor CS. Capacitors CS and CA may be sized relative to each other according to a purpose of the application. As noted above, capacitor CA may be small compared to capacitor CS so that it may subtract a portion of the sample charge from capacitor CS. The subtracted portion of charge may be large enough to compress the dynamic range of the input voltage as seen at the inverting input to the op amp 110 to reduce or prevent saturation but small enough to allow integrator circuit 100 to provide accurate output. Thus, in one example, capacitor CA has about 10% or less capacitance of sampling capacitor CS, the various applications may use different relative capacitance.

Figure 2:
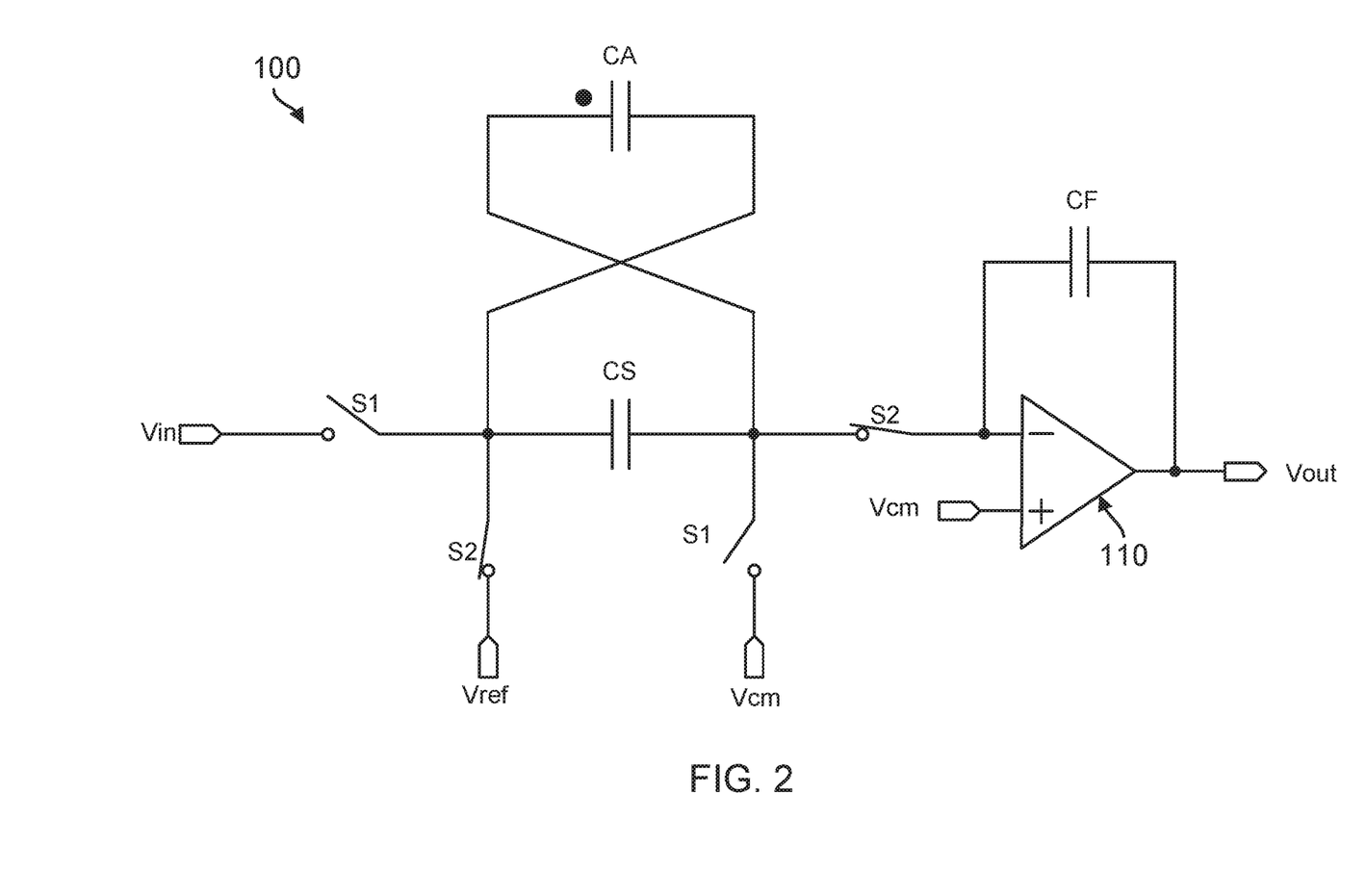
FIG. 2 is an illustration of the example integrator circuit of FIG. 1, according to one implementation.

FIG. 2 illustrates the example integrator circuit 100 according to one implementation. FIG. 2 illustrates the example integrator circuit 100 during an integration phase, following the sampling phase of FIG. 1. During the integration phase, switches S1 are turned off (open), whereas switches S2 are turned on (closed). When switches S1 are turned off, the input voltage and Vcm are electrically uncoupled or disconnected from sampling capacitor CS. Turning switches S2 on electrically couples switching capacitor CS to Vref and to the inverting input of the op amp 110.

Further during the integration phase, the polarity of additional capacitor CA is reversed compared to its polarity in FIG. 1. In other words, if a first terminal of capacitor CA was coupled to a first terminal of capacitor CS and a second terminal of capacitor CA was coupled to a second terminal of capacitor CS during the sampling phase, then the integration phase sees the terminals connected first-terminal-to-second-terminal and second-terminal-to-first-terminal. The result is that the charge stored in an additional capacitor CA during the sampling phase is discharged in the integration phase, thereby subtracting that amount of charge from capacitor CS. The output Vout represents an integration of the input voltage Vin.

The integrator circuit 100 of FIGS. 1 and 2 alternates between the sampling phase and the integration phase during operation according to a set of clocks, such as those described below with respect to FIGS. 3-5. Therefore, at least when the clocks are applied, the integrator circuit 100 performs the alternating sampling and integration phases according to the frequencies of the clocks.

Figure 3:
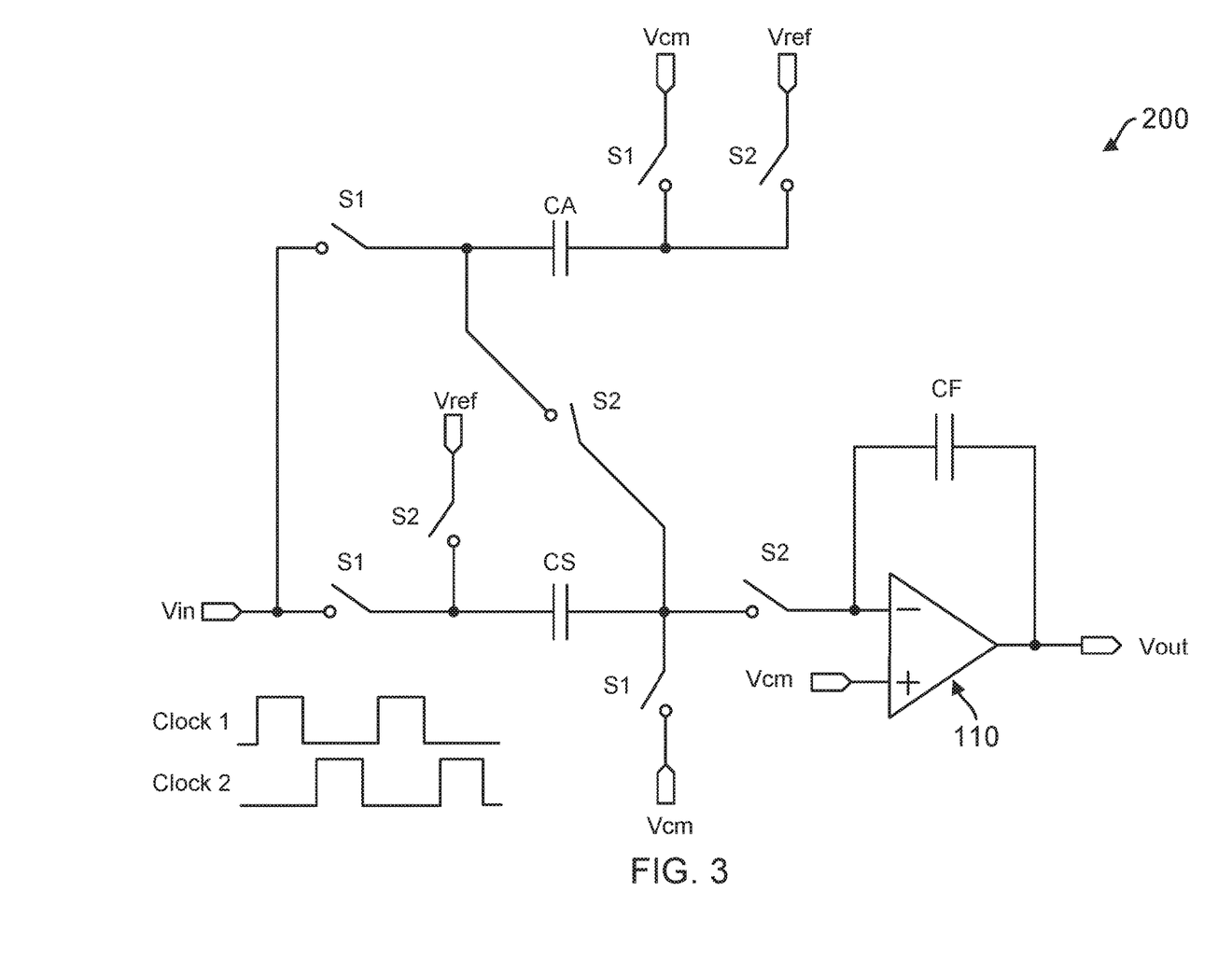
FIG. 3 is an illustration of an example architecture to build the integrator circuit of FIGS. 1 and 2, according to one implementation.

FIG. 3 is an illustration of an example integrator circuit 200, according to one implementation. Integrator circuit 200 shows one way in which the integrator circuit 100 of FIGS. 1 and 2 may be made using NMOS transistors for the switches S1 and S2 and operated by clock 1 and clock 2. The switches S1, S2 may be made using any appropriate technology. For instance, some implementations may use negative-channel metal-oxide semiconductor (NMOS) transistors so that a logic 1 applied to the gate causes the transistor to turn on. In another instance, some implementations may use positive-channel metal-oxide semiconductor (PMOS) transistors so a logic 0 applied to the gate causes the transistor to turn on. Various applications may use any appropriate transistor technology or switch technology, and the clocks described below with respect to FIGS. 4 and 5 assume NMOS transistors as an example for ease of understanding. Nevertheless, the scope of implementations is not limited to any switch technology. For instance, some implementations may use mechanical or relay switches.

Once again, the sets of switches are illustrated as a first set of switches S1 and a second set of switches S2. In this example, the switches S1 are operated according to clock 1, and the switches S2 are operated according to clock 2. Note in this example that clock 1 and clock 2 do not have overlapping areas of logic 1, though they do have overlapping areas of logic 0. Such design reduces the chance of all of the switches being closed at the same time, which might result in a short circuit or an undesirable discharge of one or more of the capacitors CS, CA, and CF. Also, in this example the integration phase and the sampling phase are non-overlapping and distinct from each other, as illustrated by the 180° offset of clock 1 and clock 2.

Additional switches are shown in FIG. 3 to describe one possible technique to allow for reversing the polarization of additional capacitor CA versus sampling capacitor CS. In this example implementation, the additional switches may also be operated according to either clock 1 or clock 2 as shown.

Figure 4:
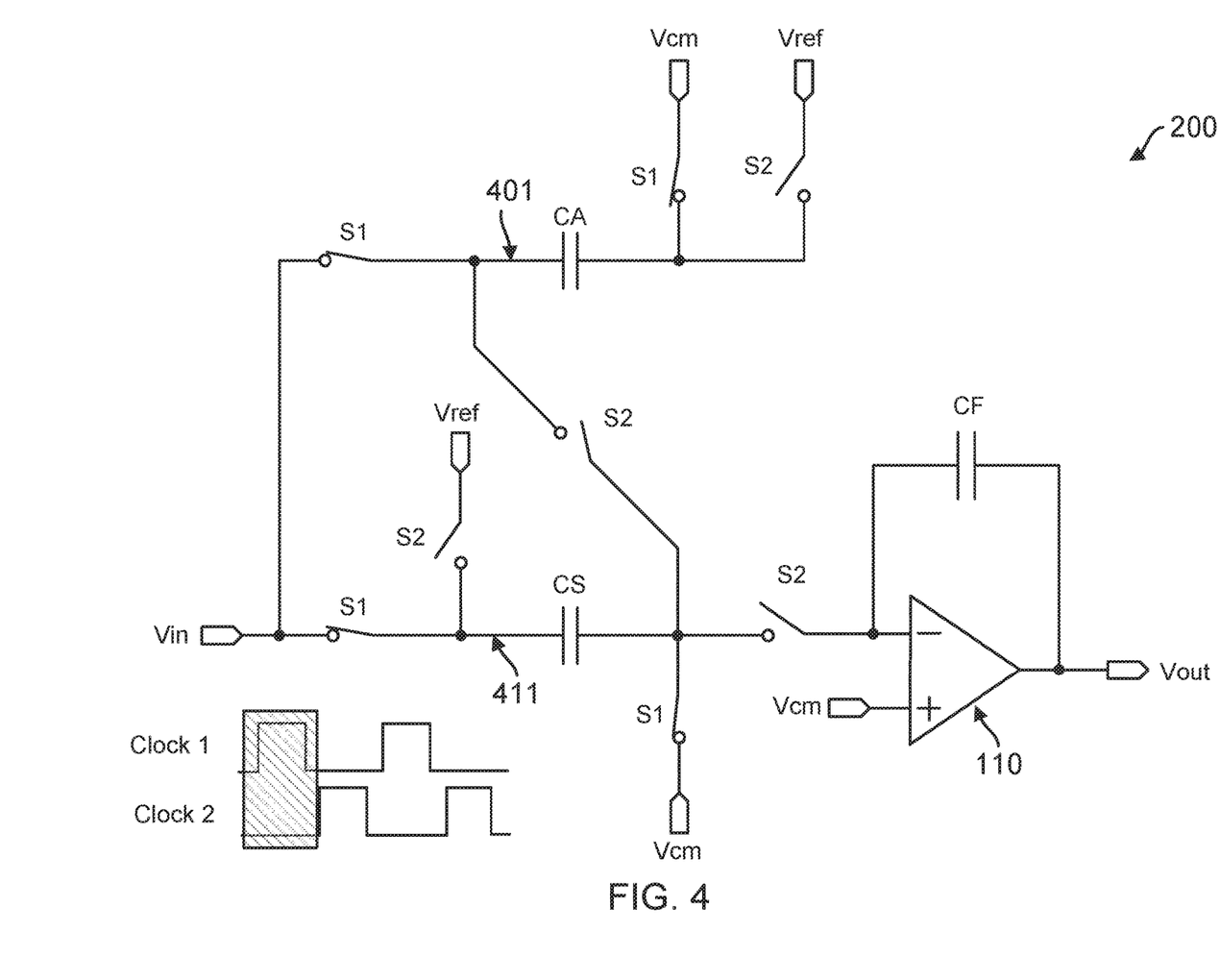
FIG. 4 is an illustration of the example integrator circuit of FIG. 3 during a sampling phase, according to one implementation.

FIG. 4 is an illustration of the example integrator circuit 200 during a sampling phase. In the example sampling phase, clock 1 is at logic 1, whereas clock 2 is at logic 0. The switches S1 are on, thereby electrically coupling the additional capacitor CA between Vcm and Vin. When switches S1 are on, they also electrically couple sampling capacitor CS between Vin and Vcm. The switches S2 are off.

Further in this example, terminal 401 of additional capacitor CA is electrically coupled to terminal 411 of sampling capacitor CS. Both capacitors Cs and CA are charged during the sampling phase. The electrical coupling is through switches S1, which are shown closed in FIG. 4.

Figure 5:
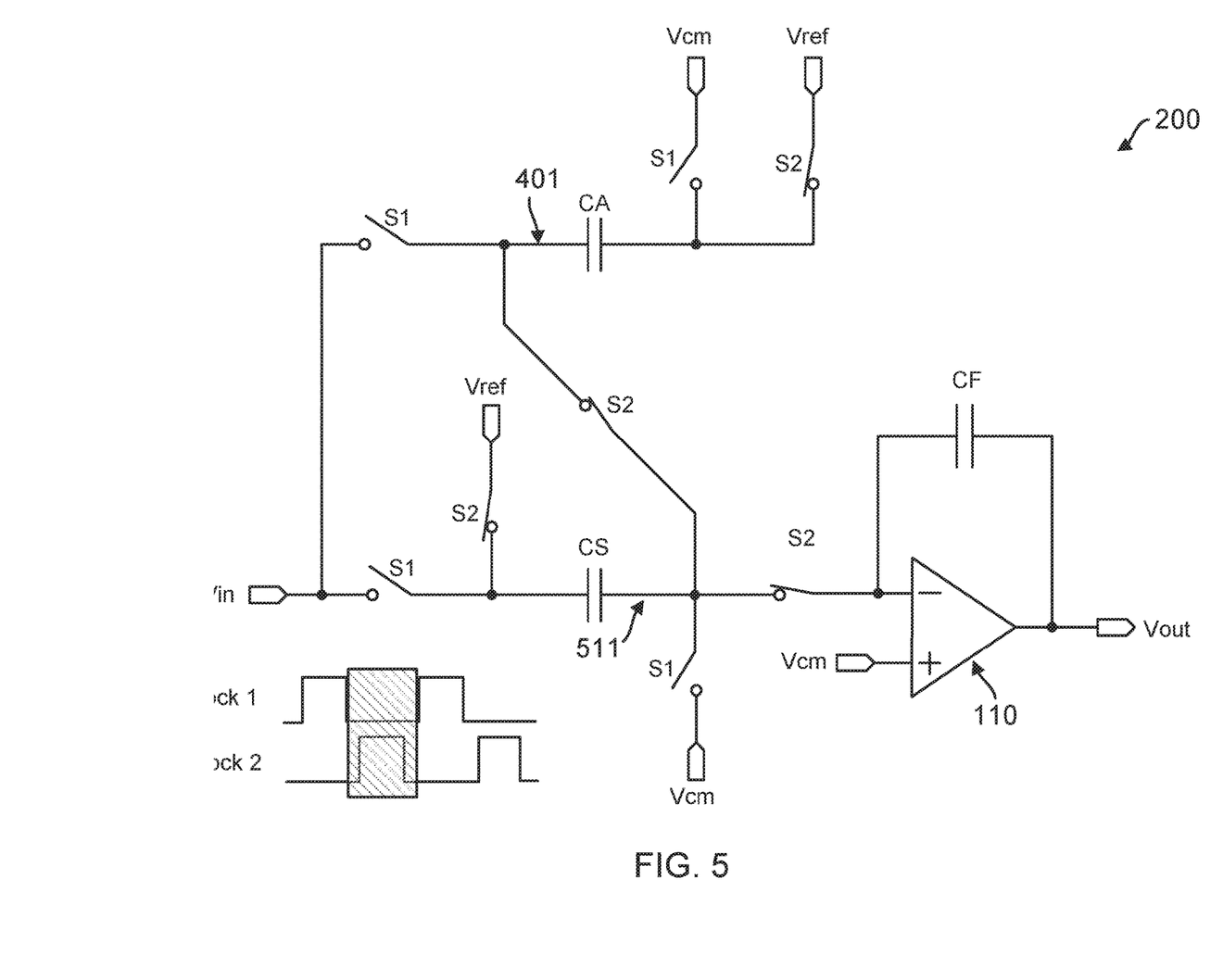
FIG. 5 is an illustration of the example integrator circuit of FIG. 3 during an integrating phase, according to one implementation.

FIG. 5 is an illustration of the example integrator circuit 200 during an integration phase. In the example integration phase, clock one is at logic 0, and clock 2 is at logic 1. The switches S2 are on, and the switches S1 are off. Therefore, additional capacitor CA is electrically coupled between Vref and the terminal 511 of sampling capacitor CS closest to the op amp 110.

The terminal 401 of additional capacitor CA is now electrically coupled to terminal 511 of the sampling capacitor CS. This electrical coupling is by virtue of the switches S2 being on, which are shown as closed in FIG. 5. Therefore, the polarity of additional capacitor CA is reversed, compared to the arrangement shown in FIG. 4, with respect to sampling capacitor CS. The capacitor CA subtracts charge from capacitor CS in the integration phase.

Integrator circuit 200 alternates between the sampling phase and the integration phase, just as described above with respect to FIGS. 1 and 2. Even though only two clock cycles are shown in FIGS. 4-5, it is understood that clocks 1 and 2 may continue to operate as long as is desired, thereby resulting in a waveform at Vout that integrates the difference Vin-Vref.

Of course, the scope of implementations is not limited to the particular implementation shown in FIGS. 4 and 5. For instance, another implementation may use PMOS transistors as the switches S1 and S2, in which case the clocks 1 and 2 would be inverted. As noted above, the scope of implementations is not limited to any switch technology.

Furthermore, the capacitors CS, CA, and CF may be implemented in any appropriate way, such as by using NMOS capacitors, metal plate capacitors, or the like. Thus, the scope of implementations is not limited to any capacitor technology.

Moreover, different types of op-amps exist, such as inverting, inverting summing, and non-inverting. The scope of implementations is not limited to any op-amp technology.

During the sampling phase, capacitors CS and CA are connected in parallel. So the charge stored in CS is given by the below equation, where $Q_S$ is the charge, and Cs is the capacitance of CS.

$$Q_S = C_S(V_{IN} - V_{CM})$$

Similarly, the charge stored in CA is given by the equation below, where $q_A$ is the charge, and $C_A$ is the capacitance of CA.

$$q_A = C_A(V_{IN} - V_{CM})$$

During the integration phase, the terminals of the capacitor CA are swapped over thus the charge $q_A$ is subtracted from $Q_S$. $Q_F$ is the charge on capacitor CF, and $\Delta Q_F$ is the portion of charge added to the total charge on CF in each integration phase.

$$Q_I = C_S(V_{REF} - V_{CM})$$

$$\Delta Q_F = Q_S - q_A - Q_I$$

$$\Delta Q_F = C_S\left[\left(1 - \frac{C_A}{C_S}\right)V_{IN} + \frac{C_A}{C_S}V_{CM} - V_{REF}\right]$$

Figure 6:
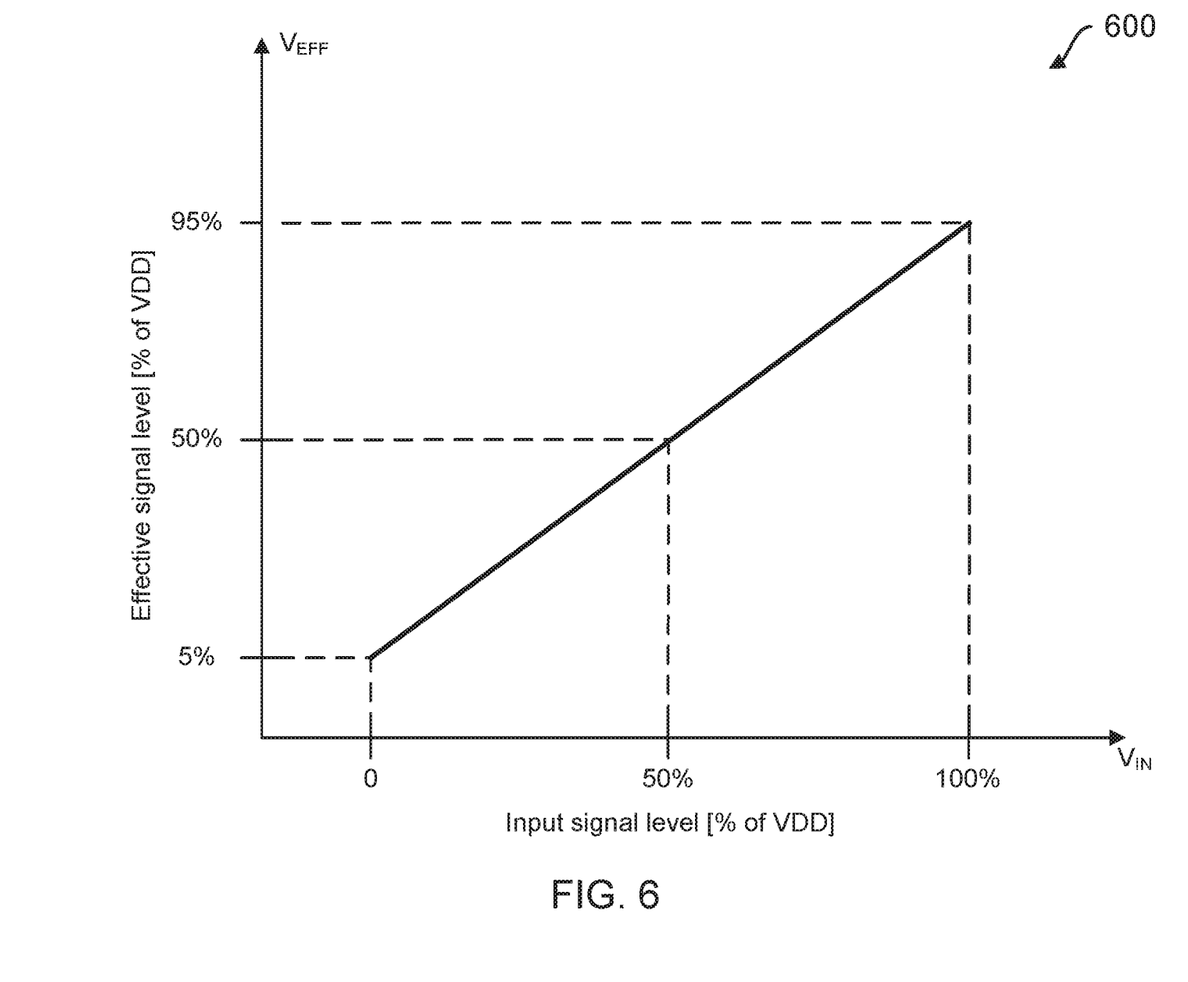
FIG. 6 is an illustration of an example curve showing dynamic range compression of an input voltage, which may be achieved using an integrator circuit according to the principles of FIGS. 1-5, according to one implementation

At this point, we introduce the concept of $V_{EFF}$ which is the compressed level of Vin. Also note how $\Delta Q_F$ can be expressed with respect to $V_{EFF}$ as shown in FIG. 6.

$$V_{EFF} = \left(1 - \frac{C_A}{C_S}\right)V_{IN} + \frac{C_A}{C_S}V_{CM}$$

$$\Delta Q_F = C_S(V_{EFF} - V_{REF})$$

The change in charge on the feedback capacitor CF for a system omitting CA would be given by:

$$\Delta Q_F = C_S(V_{IN} - V_{REF})$$

In the example implementations of FIGS. 1-5, the difference between Vin and $V_{EFF}$ results in lower or eliminated saturation in the integrator circuits. Thus, one advantage of the implementations described herein is the ability to compress the level of Vin to reduce or avoid saturation with an arrangement of capacitors and switches that does not result in excess silicon area in many applications.

FIG. 6 is an illustration of example curve 600, which plots $V_{EFF}$ against Vin in one example implementation. In this example, the ratio of the additional capacitor CA to the sampling capacitor CS is 0.1. Furthermore, Vcm is a true common mode voltage, which is equal to one half of VDD, and the rail to rail input Vin is in the range of zero to VDD. Using the equation for the effective input voltage $V_{EFF}$ (above) and plugging in the values just given, $V_{EFF}$ equals 95% of VDD for Vin=VDD and 5% for Vin=zero, respectively.

Figure 7:
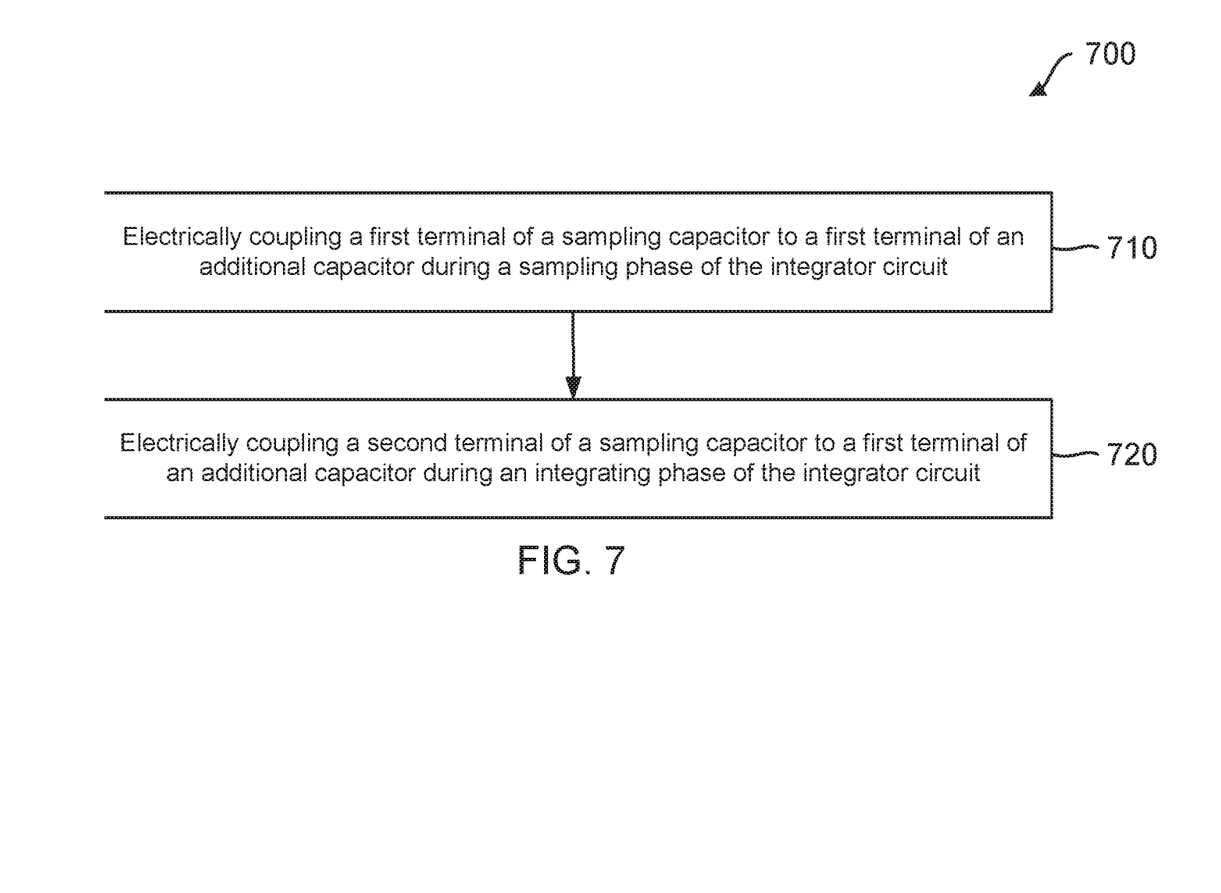
FIG. 7 is an illustration of a flow diagram of an example method of using an integrator circuit, according to one implementation.

A flow diagram of an example method 700 for operating an integrator circuit is illustrated in FIG. 7. In one example, method 700 is performed by any of the implementations shown in FIGS. 1-5 by receiving at least two clock signals and operating sets of switches, such as those shown above as switches S1 and switches S2.

At action 710, a first terminal of a sampling capacitor is electrically coupled to a first terminal of an additional capacitor during a sampling phase of the integrator circuit. An example is shown at FIG. 4, where additional capacitor CA is electrically coupled in parallel to sampling capacitor CS. In that example, terminal 401 of capacitor CA is electrically coupled to terminal 410 of sampling capacitor CS. The electrical coupling may be performed by turning on transistors which are disposed in an electrical signal path. For instance, the transistors (e.g., S1) may be controlled by a first clock. A second clock may turn off other transistors (e.g., S2).

Action 710 may also include the second terminal of the first capacitor being electrically coupled to the second terminal of the second capacitor during the sampling phase.

At action 720, a second terminal of the sampling capacitor is coupled to the first terminal of the additional capacitor during an integrating phase of the integrator circuit. For instance, in FIG. 5, terminal 401 of the additional capacitor CA is electrically coupled to the terminal 511 of the sampling capacitor CS. Once again, the electrical coupling may be performed by turning on transistors (e.g., S2) and turning off other transistors (e.g., S1) using at least two clocks. The integrating phase in this example includes subtracting a portion of the sample charge from the sampling capacitor CS before it is integrated in the op amp. Furthermore, the integrating phase in this example includes discharging the sampling capacitor to the feedback loop created by the feedback capacitor CF and the inverting input to the op amp.

Action 720 may also include the first terminal of the first capacitor being electrically coupled to the second terminal of the second capacitor during the integrating phase.

The scope of implementations is not limited to the actions shown in FIG. 7. Rather, various implementations may add, omit, rearrange, or modify various actions. For instance, some implementations may include repeating the actions 710-720 according to the frequency of the clocks.

Figure 8:
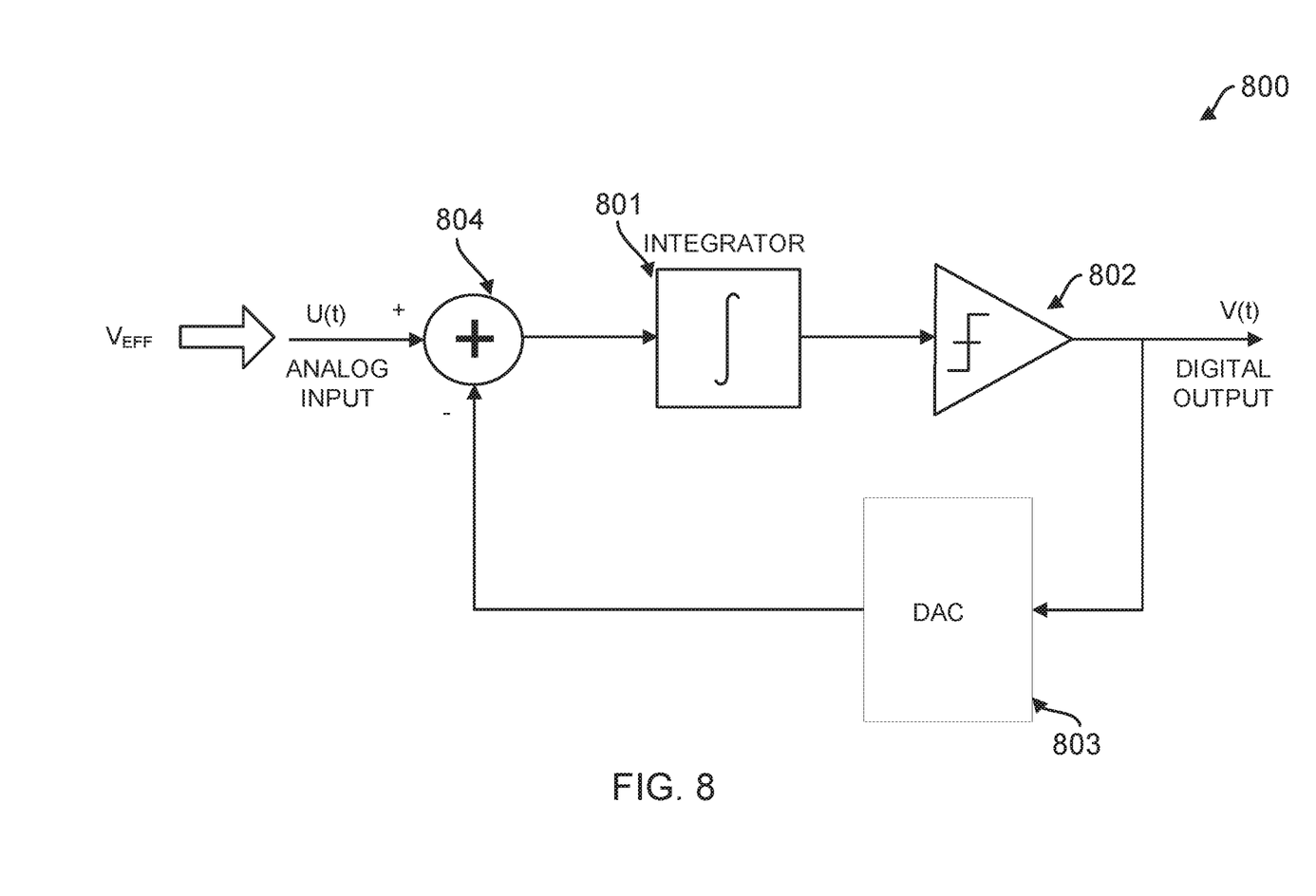
FIG. 8 is an illustration of a Sigma Delta modulator using an integrator circuit, according to one implementation.

FIG. 8 is an illustration of an example Sigma Delta modulator 800, according to one implementation. Sigma Delta modulator 800 may include an integrator block 801. The integrator implementations presented in FIG. 1-7 integrate the difference (Vin–$V_{REF}$) and thus encompass both the "+" block 804 and the integrator block 801 in FIG. 8.

Furthermore, the Sigma Delta modulator 800 may be used in some implementations as an analog-to-digital converter (ADC).

Sigma Delta modulator 800 includes the integrator block 801, which is a discrete-time, switch-capacitor integrator circuit, such as described above with respect to FIGS. 1-7. The integrator block 801 works as if the input signal Vin was scaled to $V_{EFF}$ prior to the input, as shown in FIG. 8, where $V_{EFF}$ is used as the input. The output of the integrator 801 is provided to a single-bit ADC 802. The output of the ADC 802 is fed back through digital to analog converter (DAC) 803. In a single-bit implementation, the ADC 802 is a comparator and DAC 803 is a 1-bit DAC. The scope of implementations also includes a multi-bit modulator in which the output of ADC 802 is fed back to DAC 803, where DAC 803 is scaled to an appropriate resolution. The output of the ADC 802 (Vt) is a digital output representative of a level of $V_{EFF}$, which is representative of the level of Vin.

The Sigma Delta modulator 800 of FIG. 8 may be used in a variety of applications. One such application is described in more detail with respect to FIG. 9, in which the Sigma Delta modulator 800 provides a measured output of a reference voltage within a system on chip (SOC).

Figure 9:
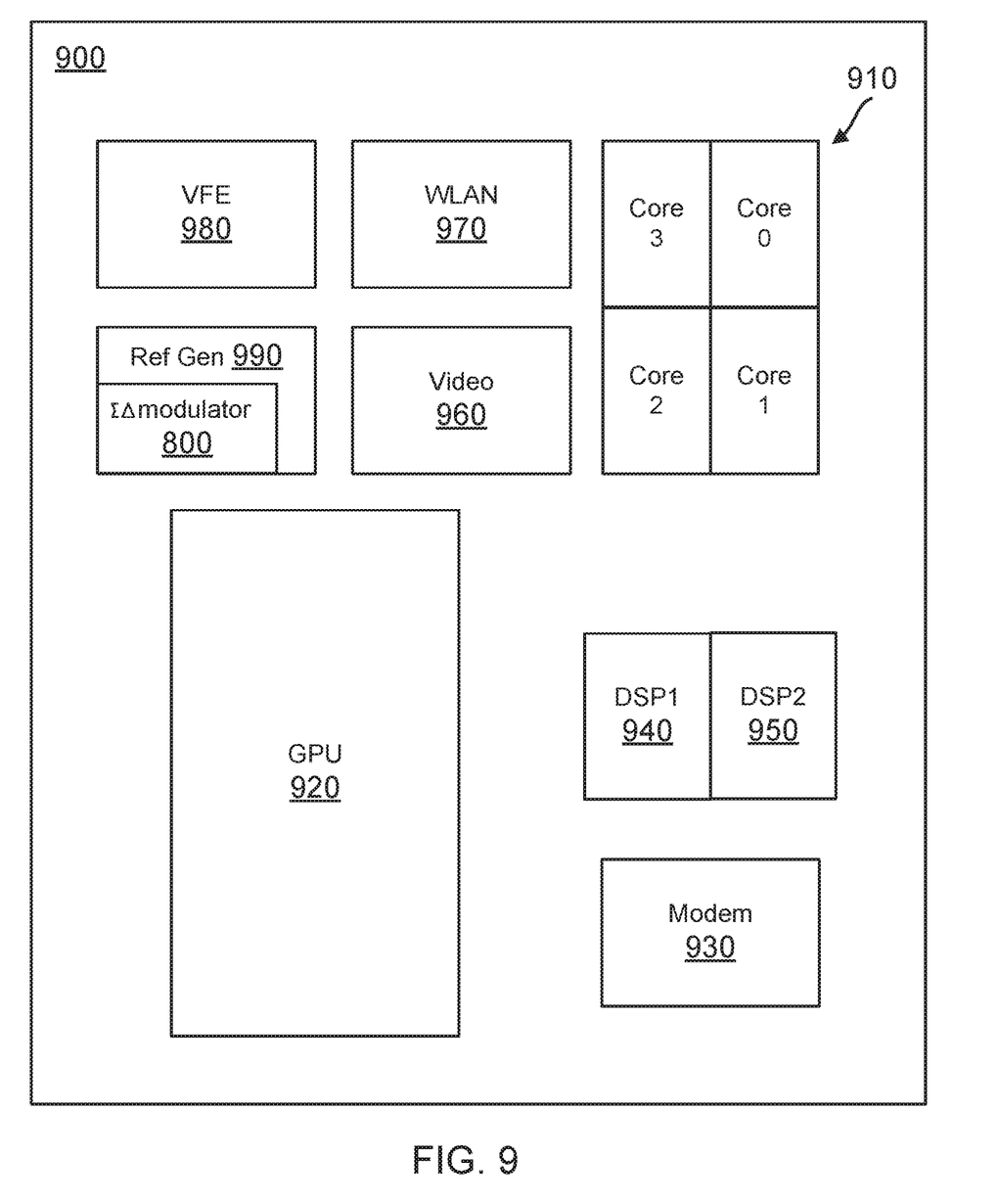
FIG. 9 is an illustration of a system on chip (SOC) implementing a Sigma Delta modulator, which may include an integrator circuit, according to one implementation.

FIG. 9 is an illustration of example SOC 900, according to one implementation. In this example, SOC 900 is implemented on a semiconductor die, and it includes multiple system components 910-990. Specifically, in this example, SOC 900 includes central processing unit (CPU) 910 that is a multi-core general-purpose processor having four processor cores, core 0-core 3. Of course, the scope of implementations is not limited to any particular number of cores, as other implementations may include two cores, eight cores, or any other appropriate number of cores in the CPU 910. SOC 900 further includes other system components, such as a first digital signal processor (DSP) 940, a second DSP 950, a modem 930, graphics processing unit (GPU) 920, a video subsystem 960, a wireless local area network (WLAN) transceiver 970, and a video-front-end (VFE) subsystem 980.

SOC 900 also includes reference generator 990, which in this example includes a bandgap reference generator. Reference generator 990 supplies reference currents and reference voltages to different components on SOC 900. For instance, each of the different components 910-980 may include various subcomponents that use a reference voltage or reference current. Examples of subcomponents that may use a reference voltage or a reference current include low dropout (LDO) voltage regulators, ADCs, current mode logic (CML) buffers, phase locked loops (PLLs), delay locked loops (DLLs), amplifiers, filters, serializer deserializer physical interfaces (SERDES PHYs) and various loads. Such subcomponents are not explicitly shown in FIG. 9, but it is understood that the SOC of FIG. 9 would be expected to include multiple subcomponents employing reference voltages or currents.

SOC 900 may implement the Sigma Delta modulator 800 to measure the bandgap voltage from reference generator 990. For instance, the Sigma Delta modulator 800 when implemented using an integrator circuit according to the architectures shown in FIGS. 1-5 would input the bandgap voltage from reference generator 990 as Vin and use VDD from a power rail as Vref. Ground can be either a common mode voltage or a ground power rail (e.g., voltage source-source, VSS). In the case where the bandgap voltage from the reference generator 990 has a similar range as VDD, then the integrator circuit would compress the dynamic range of the bandgap voltage to avoid saturation of the integrator and ensure an accurate output of the Sigma Delta modulator 800.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. An integrator circuit comprising:
    an operational amplifier;
    a first capacitor coupled to an input of the operational amplifier;
    a second capacitor coupled in parallel to the first capacitor so that a first terminal of the first capacitor is configured to be electrically coupled to a first terminal of the second capacitor by a first switch; and
    a second switch configured to electrically couple the first terminal of the second capacitor to a second terminal of the first capacitor.

2. The integrator circuit of claim 1, wherein a capacitance of the second capacitor is less than a capacitance of the first capacitor.

3. The integrator circuit of claim 1, further comprising a first clock signal applied to the first switch and a second clock signal applied to the second switch, wherein the first clock signal and the second clock signal are non-overlapping.

4. The integrator circuit of claim 1, wherein the first switch is configured to electrically couple the first terminal of the first capacitor to the first terminal of the second capacitor during a sampling phase of the integrator circuit, wherein the sampling phase includes charging the first capacitor.

5. The integrator circuit of claim 1, wherein the second switch is configured to electrically couple the first terminal of the second capacitor to the second terminal of the first capacitor during an integrating phase of the integrator circuit, wherein the integrating phase includes discharging the first capacitor.

6. The integrator circuit of claim 5, wherein a sampling phase and the integrating phase are non-overlapping.

7. The integrator circuit of claim 1, wherein the first switch is configured to electrically couple the first terminal of the second capacitor to a voltage input of the integrator circuit.

8. The integrator circuit of claim 1, wherein the second switch is configured to electrically couple the first terminal of the second capacitor to the input of the operational amplifier.

9. The integrator circuit of claim 1, further comprising a third switch, wherein the third switch is configured to electrically couple a second terminal of the second capacitor to a power rail of the integrator circuit, and wherein the third switch receives a same clock signal as the second switch.

10. The integrator circuit of claim 1, further comprising a third switch, wherein the third switch is configured to electrically couple a second terminal of the second capacitor to a reference voltage of the integrator circuit, and wherein the third switch receives a same clock signal as the second switch.

11. The integrator circuit of claim 1, further comprising a third switch, wherein the third switch is configured to electrically couple a second terminal of the first capacitor to an inverting input of the operational amplifier, and wherein the third switch receives a same clock signal as the second switch.

12. The integrator circuit of claim 1, wherein the integrator circuit is included in a Sigma Delta modulator.

13. The integrator circuit of claim 12, wherein the Sigma Delta modulator comprises an analog to digital converter (ADC).

14. The integrator circuit of claim 12, wherein the Sigma Delta modulator is configured to measure an output of a bandgap reference generator.

15. The integrator circuit of claim 1, wherein the integrator circuit comprises a discrete-time, switched-capacitor integrator.

16. A method of operating an integrator circuit, the method comprising:
    electrically coupling a first terminal of a first capacitor to a first terminal of a second capacitor during a sampling phase of the integrator circuit; and
    electrically coupling a second terminal of the first capacitor to the first terminal of the second capacitor during an integrating phase of the integrator circuit.

17. The method of claim 16, wherein the second terminal of the first capacitor is electrically coupled to the second terminal of the second capacitor during the sampling phase.

18. The method of claim 16, wherein the first terminal of the first capacitor is electrically coupled to the second terminal of the second capacitor during the integrating phase.

19. An integrator circuit comprising:
    an operational amplifier;
    a first capacitor coupled to an input of the operational amplifier;
    a second capacitor; and
    means for electrically coupling the second capacitor in parallel to the first capacitor during a sampling phase of the integrator circuit and for reversing a polarity of the second capacitor with respect to the first capacitor during an integrating phase of the integrator circuit.

20. The integrator circuit of claim 19, wherein the electrically coupling means comprises a first switch configured to couple a first terminal of the first capacitor to a first terminal of the second capacitor.

21. The integrator circuit of claim 20, wherein the electrically coupling means further comprises:
    a second switch configured to electrically couple the first terminal of the second capacitor to a second terminal of the first capacitor.

22. The integrator circuit of claim 21, further comprising a third switch, wherein the third switch is configured to electrically couple a second terminal of the second capacitor to a power rail of the integrator circuit, and wherein the third switch receives a same clock signal as the second switch.

23. The integrator circuit of claim 21, further comprising a third switch, wherein the third switch is configured to electrically couple a second terminal of the second capacitor to a reference voltage of the integrator circuit, and wherein the third switch receives a same clock signal as the second switch.

24. The integrator circuit of claim 21, further comprising a third switch, wherein the third switch is configured to electrically couple a second terminal of the first capacitor to an inverting input of the operational amplifier, and wherein the third switch receives a same clock signal as the second switch.

25. The integrator circuit of claim 19, wherein a capacitance of the second capacitor is less than a capacitance of the first capacitor.

26. A system on chip (SOC) comprising:
- a bandgap reference generator configured to produce a bandgap voltage; and
- an analog-to-digital converter (ADC) coupled to receive the bandgap voltage from the bandgap reference generator; wherein the ADC includes an integrator circuit having a first capacitor and a second capacitor, the second capacitor being coupled in parallel to the first capacitor so that a first terminal of the first capacitor is configured to be electrically coupled to a first terminal of the second capacitor by a first switch and a second switch configured to electrically couple the first terminal of the second capacitor to a second terminal of the first capacitor.

27. The SOC of claim 26, wherein the ADC comprises a Sigma Delta modulator.

* * * * *